(12) United States Patent
Kim

(10) Patent No.: US 9,583,706 B2
(45) Date of Patent: Feb. 28, 2017

(54) SEMICONDUCTOR APPARATUS AND METHOD FOR FABRICATING THE SAME

(71) Applicant: SK hynix Inc., Gyeonggi-do (KR)

(72) Inventor: Hyung Keun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/516,172

(22) Filed: Oct. 16, 2014

(65) Prior Publication Data

US 2016/0013408 A1    Jan. 14, 2016

(30) Foreign Application Priority Data

Jul. 9, 2014 (KR) .................. 10-2014-0086283

(51) Int. Cl.
*H01L 45/00* (2006.01)
*H01L 27/22* (2006.01)
*H01L 27/24* (2006.01)
*H01L 43/08* (2006.01)
*H01L 43/12* (2006.01)

(52) U.S. Cl.
CPC ........ *H01L 45/1675* (2013.01); *H01L 27/222* (2013.01); *H01L 27/2463* (2013.01); *H01L 43/08* (2013.01); *H01L 43/12* (2013.01); *H01L 45/04* (2013.01); *H01L 45/06* (2013.01); *H01L 45/1233* (2013.01); *H01L 45/14* (2013.01); *H01L 45/141* (2013.01); *H01L 45/147* (2013.01)

(58) Field of Classification Search
None
See application file for complete search history.

(56) References Cited

U.S. PATENT DOCUMENTS 8,841,196 B1 * 9/2014 Harold .................. H01L 45/085
257/E21.003

FOREIGN PATENT DOCUMENTS

KR    100951661    4/2010

* cited by examiner

*Primary Examiner* — Robert Carpenter
(74) *Attorney, Agent, or Firm* — I P & T Group LLP

(57) ABSTRACT

A method for fabricating a semiconductor apparatus includes providing a semiconductor substrate, stacking a conductive layer, a variable resistance layer, and a sacrificial layer on the semiconductor substrate, etching the conductive layer, the variable resistance layer, and the sacrificial layer to form a pillar structure including a lower electrode, a variable resistor device, and a sacrificial layer pattern, removing the sacrificial layer pattern, and forming an upper electrode over the variable resistor device in a hole which is formed by removing the sacrificial layer pattern.

13 Claims, 4 Drawing Sheets

SEMICONDUCTOR APPARATUS AND METHOD FOR FABRICATING THE SAME

CROSS-REFERENCES TO RELATED APPLICATION

This application claims priority under 35 U.S.C. 119(a) to Korean application No. 10-2014-0086283, filed on Jul. 9, 2014, in the Korean intellectual property Office, which is incorporated by reference in its entirety as set forth in full.

BACKGROUND

1. Technical Field

Various embodiments relate to a semiconductor apparatus having variable resistance characteristics, and a method for fabricating the same.

2. Related Art

With the rapid development of mobile and digital information communication and consumer-electronic industries, studies on existing electronic charge-controlled devices may encounter limitations. Thus, new functional memory devices other than the existing electronic charge-controlled devices need to be developed. In particular, next-generation memory devices with large capacity, ultra-high speed, and ultra-low power need to be developed to satisfy demands for large capacity memories in main information apparatuses.

Currently, variable resistive memory devices using a resistance material as a memory medium have been suggested as the next-generation memory devices. Typical examples of resistance variable memory devices include phase-change random access memories (PCRAMs), resistive RAMs (ReRAMs), magneto-resistive RAMs (MRAMs), and spin-transfer torque magnetoresistive RAMs (STTMRAMs).

A variable resistive memory device may include a semiconductor substrate having a switching device, a lower electrode, a variable resistor device, and an upper electrode. As the design is scaled down, the lower electrode, the variable resistor device, and the upper electrode may be formed in a small hole. For example, the variable resistor device may be formed through a process of forming an insulating layer on the semiconductor substrate including the lower electrode, forming a hole in the insulating layer, gap-filling the hole with a variable resistance material, and performing a recess process on the variable resistance material.

However, in the variable resistive memory device of related art, in the above-described process of gap-filling a hole with a lower electrode material, a variable resistor device, and an upper electrode and recessing the material is repeated, height variation among cells may increase and defects such as voids or seams may occur.

SUMMARY

According to an embodiment, a method for fabricating a semiconductor apparatus is provided. The method may include providing a semiconductor substrate including a bottom structure, stacking a conductive layer, a variable resistance layer, and a sacrificial layer on the semiconductor substrate, etching the conductive layer, the variable resistance layer, and the sacrificial layer to form a pillar structure which corresponds to the bottom structure and includes a lower electrode, a variable resistor device, and a sacrificial layer pattern, forming an intercell insulating layer between pillars, removing the sacrificial layer pattern, and forming an upper electrode having a contact cross-sectional area smaller than a cross-sectional area of the variable resistor device on the variable resistor device from which the sacrificial layer pattern is removed.

According to an embodiment, a semiconductor apparatus is provided. The semiconductor apparatus may include a semiconductor substrate having a bottom structure, a lower electrode formed on a location of the semiconductor substrate corresponding to the bottom structure, a variable resistor device formed on the lower electrode, and an upper electrode formed on the variable resistor device. A contact cross-sectional area between the variable resistor device and the upper electrode may be smaller than a cross-sectional area of the variable resistor device.

These and other features, aspects, and embodiments are described below in the section entitled "DETAILED DESCRIPTION".

BRIEF DESCRIPTION OF THE DRAWINGS

The above and other aspects, features and advantages of embodiments will be more clearly understood from the following detailed description taken in conjunction with the accompanying drawings, in which.

DETAILED DESCRIPTION

Figure 1:
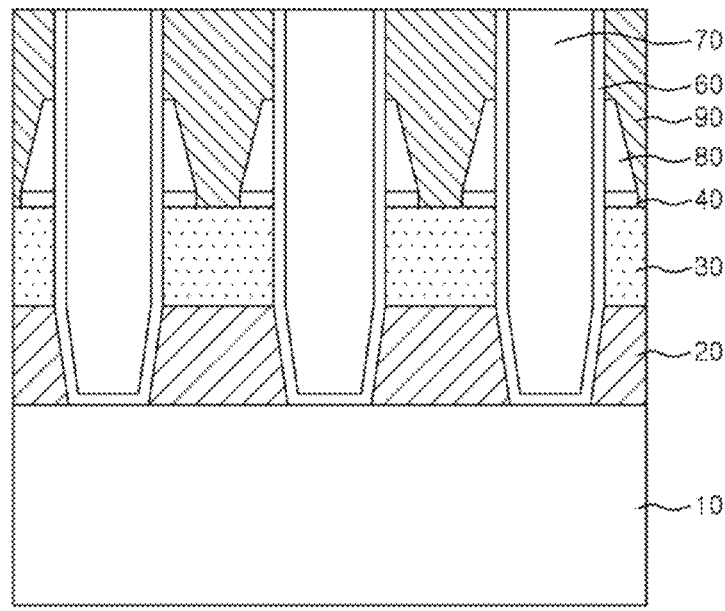
FIG. 1 is a cross-sectional view illustrating a semiconductor apparatus according to an embodiment.

Exemplary embodiments will be described in greater detail with reference to the accompanying drawings. Exemplary embodiments are described herein with reference to cross-sectional illustrations that are schematic illustrations of exemplary embodiments (and intermediate structures). As such, variations in shapes of the Illustrations, for example, due to differences in manufacturing techniques and/or tolerances, are to be expected. Thus, embodiments should not be construed as limited to the particular shapes of regions illustrated herein but may include deviations in shapes that result, for example, from manufacturing techniques and/or tolerances. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form, and vice versa, as long as it is not specifically mentioned otherwise.

Embodiments are described herein with reference to cross-section and/or plan illustrations that are schematic illustrations of the embodiments. However, the scope of the present invention is not limited to the embodiments.

FIG. 1 is a cross-sectional view illustrating a semiconductor apparatus according to an embodiment.

Referring to FIG. 1, a semiconductor apparatus according to an embodiment may include a semiconductor substrate 10 having a bottom structure, and a lower electrode 20, a variable resistor device 30, and an upper electrode 90 sequentially formed on the semiconductor substrate 10. The lower electrode 20, the variable resistor device 30, and the upper electrode 90 may be formed substantially in pillar form on the semiconductor substrate 10 as illustrated in FIG. 1.

The bottom structure may include a word line (not shown) and an access device, and the word line and the access device are known, and thus a detailed description thereof will be omitted.

The lower electrode 20 may be electrically coupled to the access device on the semiconductor substrate 10, and the lower electrode 20 may include a doped polysilicon layer or a metal material having high resistivity. For example, the lower electrode 20 may include titanium nitride (TiN).

The variable resistor device 30 may be formed on the lower electrode 20. A variable resistance material for the variable resistor device 30 may include various materials such as a PCMO ($Pr_{1-x}Ca_xMnO_3$) layer for a ReRAM, a chalcogenide layer for a PCRAM, a magnetic layer for a MRAM, a magnetization reversal device layer for a STT-MRAM, or a polymer layer for a polymer RAM (PoRAM). However, the material for the variable resistor device 30 is not limited thereto, and may include any material having a variable resistance characteristic which is switched between different resistive states according to a voltage or current applied thereto.

The upper electrode 90 may be formed on the variable resistor device 30, and the upper electrode 90 may include the same material as the lower electrode 20. The upper electrode may include a doped polysilicon layer or a metal material having high resistivity. For example, the upper electrode 90 may include titanium nitride (TiN).

A spacer 80 may be formed on an outer side of a lower portion of the upper electrode 90. The spacer 80 may maintain cell resistance at a certain level, and may keep the height of the variable resistor device 30 uniform.

In other words, to ensure the cell resistance of the semiconductor apparatus, it is necessary to increase the height of the variable resistor device 30 by considering the contact area between the upper electrode 90 and the variable resistor device 30. When the height of the variable resistor device 30 is increased, the cell resistance is easily ensured. However, the lower electrode 20, the variable resistor device 30, and the upper electrode 90 have to be formed in a pillar form, and this may result in leaning issues in with the pillar. However, in an embodiment, a spacer 80 is formed on the outer side of the lower portion of the upper electrode 90, and a bottom cross-sectional area of the upper electrode 90 which is in contact with the variable resistor device 30 becomes smaller than the cross-sectional area of the variable resistor device 30. Therefore, the cell resistance may be easily ensured and simultaneously an increase in the height of the variable resistor device 30 may be prevented.

The reference numeral 40 denotes a protection layer for preventing loss of the variable resistor device 30. The reference numeral 60 denotes a capping layer for capping lateral surfaces (sidewalls) of a structure constituted of the lower electrode 20, the variable resistor device 30, the protection layer 40, and the upper electrode 90. The reference numeral 70 denotes an intercell insulating layer formed between cells.

FIGS. 2 to 7 are cross-sectional views illustrating a method for fabricating a semiconductor apparatus according to an embodiment.

Figure 2:
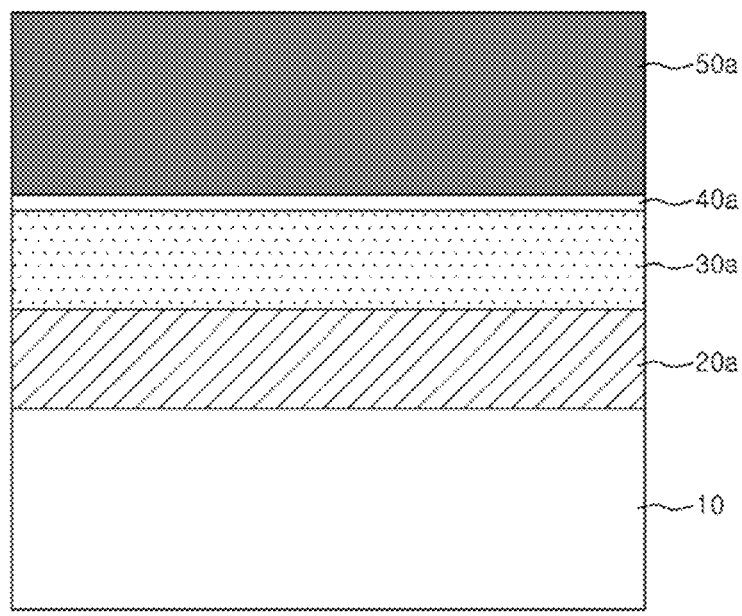
FIG. 2 is a cross-sectional view illustrating a method for fabricating a semiconductor apparatus according to an embodiment.

Referring to FIG. 2, a conductive layer 20a, a variable resistance layer 30a, a protection layer 40a, and a sacrificial layer 50a are sequentially formed on a semiconductor substrate 10 in which a bottom structure is formed.

The bottom structure may include a word line (not shown) and an access device (not shown), and the word line and the access device are known, and thus a detailed description thereof will be omitted.

Figure 3:
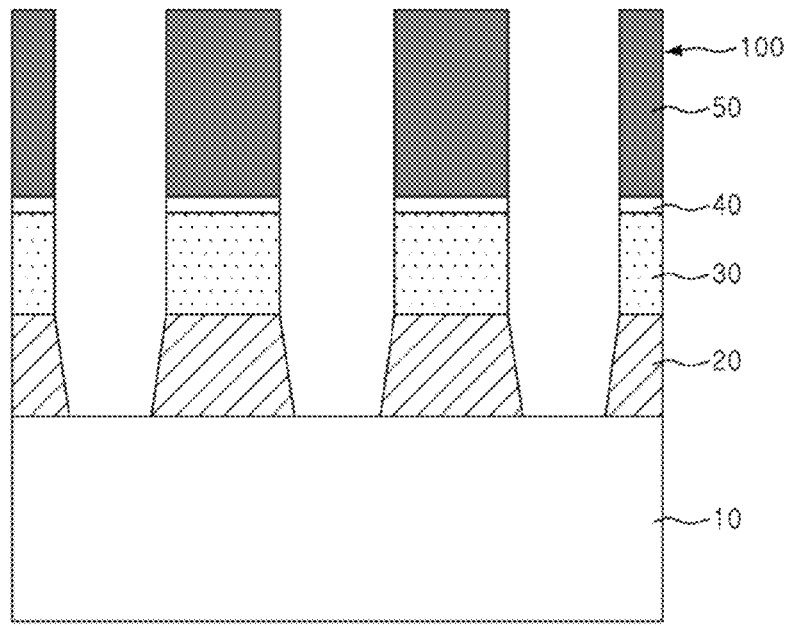
FIG. 3 is a cross-sectional view illustrating a method for fabricating a semiconductor apparatus according to an embodiment.

The conductive layer 20a is used to form a lower electrode (see 20 of FIG. 3). The conductive layer 20a may be formed of titanium nitride (TiN), but the material for the conductive layer 20a is not limited thereto.

The variable resistance layer 30a is used to form a variable resistor device (see 30 of FIG. 3). The variable resistor device 30 may include any one of a ReRAM, a PCRAM, a MRAM, a STTRAM, and a PoRAM. In particular, when the variable resistor device 30 is a PCRAM, the chalcogenide material is formed on the conductive layer 20a, and an atomic layer deposition (ALD) method as well as a physical vapor deposition (PVD) method may be used to deposit the chalcogenide material. The phase-change material may be selected amongst various options known to those skilled in the art.

The protection layer 40a serves to protect the variable resistance layer 30a. The protection layer 40a may be formed using a material which is not removed when a sacrificial layer pattern (see 50 of FIG. 3) is removed in a subsequent process. For example, the protection layer 40a may be formed of a material including silicon nitride or nitride-containing material.

The sacrificial layer 50a may be formed of a material including silicon oxide or oxide-containing material, which does not thermally attack the variable resistance layer 30a when the sacrificial layer pattern 50 is removed in the subsequent process.

Referring to FIG. 3, the sacrificial layer 50a, the protection layer 40a, the variable resistance layer 30a, and the conductive layer 20a are patterned to form a pillar-shaped structure 100. The pillar-shaped structure 100 may include the lower electrode 20, the variable resistor device 30, a protection layer pattern 40, and the sacrificial layer pattern 50. In the patterning process, the process temperature may be in a range of 50 to 70° C., pressure may be about 5 to 10 mTorr, plasma power may be 700 to 800 W, and a reaction gas may be $BCl_3$, $CHF_3$, $N_2$ gas, or a combination thereof.

Figure 4:
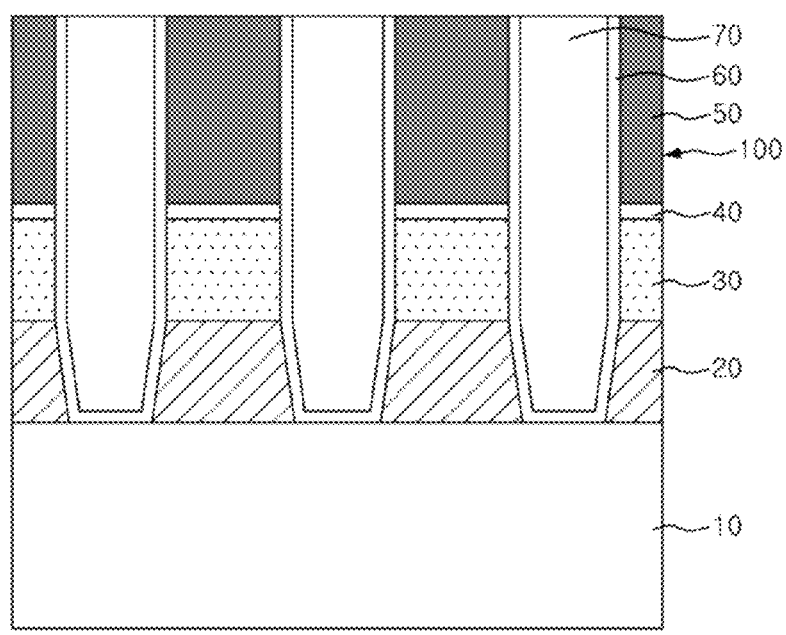
FIG. 4 is a cross-sectional view illustrating a method for fabricating a semiconductor apparatus according to an embodiment.

Referring to FIG. 4, a capping layer 60 is formed on the semiconductor substrate in which the pillar-shaped structure 100 is formed. An intercell insulating layer 70 is gap-filled in a space between pillar-shaped structures 100, and the intercell insulating layer 70 and the capping layer 60 are planarized to expose an upper surface of the sacrificial layer pattern 50.

The capping layer 60 may be formed of a material which is not removed when the sacrificial layer pattern 50 is removed in a subsequent process, that is, a material having an etch selectivity to the sacrificial layer pattern 50. For example, the capping layer 60 may include silicon nitride or nitride-containing material.

The intercell insulating layer 70 may also be formed of a material which is not removed when the sacrificial layer pattern 50 is removed in a subsequent process, that is, a material having an etch selectivity to the sacrificial layer pattern 50. For example, the intercell insulating layer 70 may be formed of a material including silicon nitride or nitride-containing material.

Figure 5:
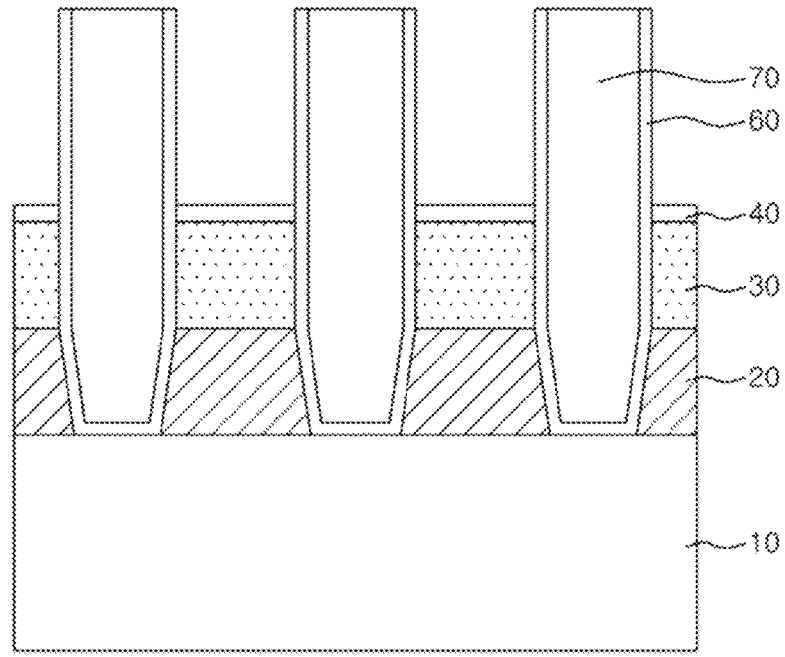
FIG. 5 is a cross-sectional view illustrating a method for fabricating a semiconductor apparatus according to an embodiment.

Referring to FIG. 5, the exposed sacrificial layer pattern 50 is selectively removed to expose a surface of the protection layer pattern 40. The sacrificial layer pattern 50 may be removed through a dip-out process, that is, a wet etch process using an oxide layer etchant, but the method of selectively removing the sacrificial layer pattern 50 is not limited thereto. In the removing process, only the sacrificial layer pattern 50 is selectively removed, and the intercell insulating layer 70, the capping layer 60, and the protection layer pattern 40 are formed of a material having a different etch selectivity from the sacrificial layer pattern 50, and thus may not be removed.

Figure 6:
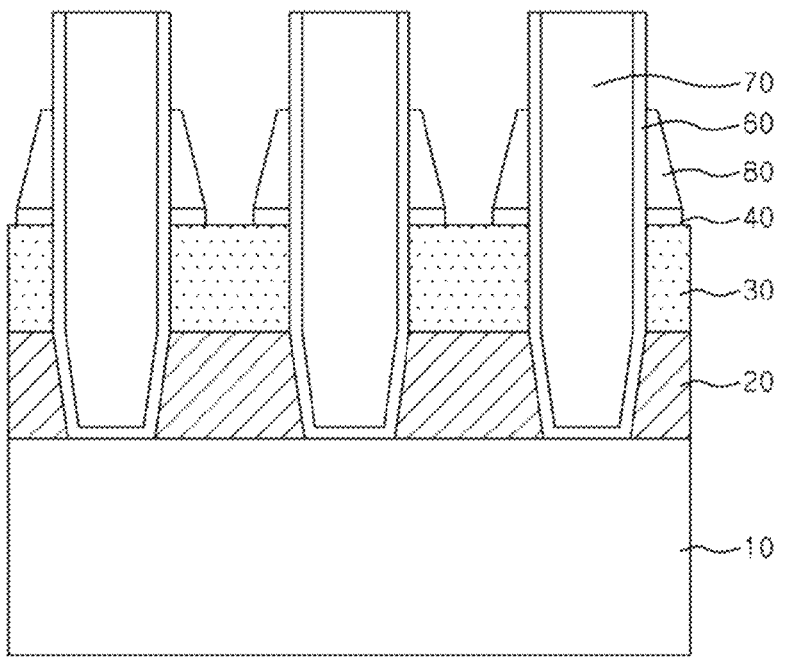
FIG. 6 is a cross-sectional view illustrating a method for fabricating a semiconductor apparatus according to an embodiment.

Referring to FIG. 6, a spacer formation material (not shown) is thinly formed in a hole which is generated by removing the sacrificial layer pattern 50. The spacer formation material is etched to form a spacer 80. The spacer 80 may be formed of a material having the same etch selectivity to the protection layer pattern 40 or a material having etch selectivity similar to the protection layer pattern 40. In the above-described etching process of the spacer formation material, a portion of the protection layer pattern 40 having the same etch selectivity to the spacer 80 or having etch selectivity similar to the spacer 80 may be etched, and thus a partial surface of the variable resistor device 30 may be exposed.

Figure 7:
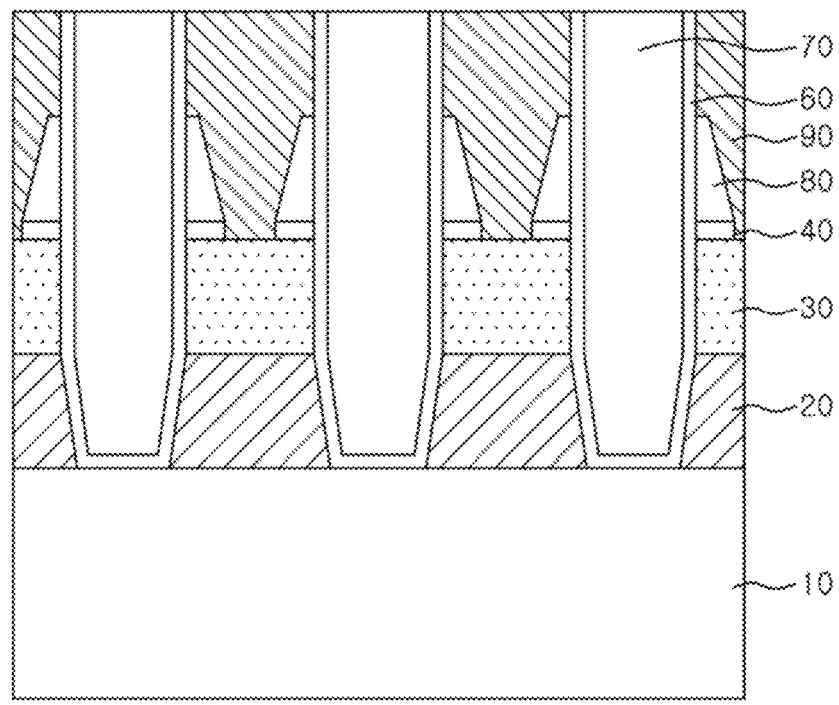
FIG. 7 is a cross-sectional view illustrating a method for fabricating a semiconductor apparatus according to an embodiment.

Referring to FIG. 7, a conductive material is gap-filled in the hole in which the spacer 80 is formed. The conductive material is planarized to expose surfaces of the capping layer 60 and the intercell insulating layer 70. As a result, an upper electrode 90 is formed. The conductive material for the upper electrode 90 may include titanium nitride (TiN), but the conductive material for the upper electrode 90 is not limited thereto.

As described above, the semiconductor apparatus in an embodiment may be formed through a series of processes of forming the conductive layer 20a, the variable resistance layer 30a, and the sacrificial layer 50a on the semiconductor substrate 10 including a bottom structure, spacer-etching the conductive layer 20a, the variable resistance layer 30a, and the sacrificial layer 50a to form the lower electrode 20, the variable resistor device 30, and the sacrificial layer pattern 50, removing the sacrificial layer pattern 50, and forming the spacer 80 and the upper electrode 90 in a space (or a hole) from which the sacrificial layer pattern 50 is removed Therefore, each cell may have a certain height. In other words, the semiconductor apparatus of the embodiment is formed through a process of gap-filling the hole with a predetermined material (conductive material or variable resistance material) and recessing the material. Therefore, unlike the semiconductor apparatus in the related art in which height variation in cells is increased as the stacking is repeated, the cells may have uniform heights since the height of the variable resistor device 30 is determined through deposition.

The semiconductor apparatus in an embodiment may be formed through a series of processes of forming the conductive layer 20a, the variable resistance layer 30a, and the sacrificial layer 50a on the semiconductor substrate 10 including a bottom structure, spacer-etching the conductive layer 20a, the variable resistance layer 30a, and the sacrificial layer 50a to form the lower electrode 20, the variable resistor device 30, and the sacrificial layer pattern 50, removing the sacrificial layer pattern 50, and forming the spacer 80 and the upper electrode 90 in a space from which the sacrificial layer pattern 50 is removed. Therefore, when the lower electrode 20 and the variable resistor device 30 are formed, defects such as voids or seams may be prevented. In other words, unlike the semiconductor apparatus of the related art which is formed through a method of gap-filling the hole with a predetermined material (conductive material or variable resistance material) and recessing the material to cause defects in the gap-filling of the material, the semiconductor apparatus in the embodiment may prevent the generation of defects.

The semiconductor apparatus in an embodiment forms the spacer 80 on the variable resistor device 30 and then forms the upper electrode 90. The spacer 80 reduces a bottom critical dimension of the upper electrode 90 which is in contact with the variable resistor device 30. Therefore, cell resistance may be easily ensured and the height of the variable resistor device 30 may be reduced.

The above embodiments are illustrative and not limitative. Various alternatives and modifications are possible. Nor are the embodiments limited to any specific type of semiconductor device.

What is claimed is:

1. A method for fabricating a semiconductor apparatus, the method comprising:
    providing a semiconductor substrate;
    stacking a conductive layer, a variable resistance layer, and a sacrificial layer over the semiconductor substrate;
    etching the conductive layer, the variable resistance layer, and the sacrificial layer to form a pillar structure which includes a lower electrode, a variable resistor device, and a sacrificial layer pattern;
    forming an intercell insulating layer between the pillar structure and a neighboring pillar structure;
    planarizing the intercell insulating layer to expose a surface of the sacrificial layer pattern;
    removing the sacrificial layer pattern; and
    forming an upper electrode, which has a contact area between the upper electrode and the variable resistor device, over the variable resistor device in a hole which is formed by removing the sacrificial layer pattern,
    wherein the contact area between the upper electrode and the variable resistor device is smaller than an upper surface area of the variable resistor device.

2. The method of claim 1, wherein the variable resistance layer includes any one of a PCMO layer, a chalcogenide layer, a magnetic layer, a magnetization reversal device layer, and a polymer layer.

3. The method of claim 1, wherein the stacking of the conductive layer, the variable resistance layer, and the sacrificial layer further includes:
    stacking a protection layer suitable to protect the variable resistance layer between the variable resistance layer and the sacrificial layer,
    wherein the protection layer is etched to form a protection layer pattern during the forming of the pillar structure.

4. The method of claim 3, further comprising:
    after the forming of the pillar structure, forming a capping layer in the hole and over the semiconductor substrate between the pillar structure and the neighboring pillar structure.

5. The method of claim 4, wherein the planarizing of the intercell insulating layer includes planarizing the capping layer to expose flail the surface of the sacrificial layer pattern.

6. The method of claim 3, wherein the removing of the sacrificial layer pattern includes removing the sacrificial layer pattern through a wet etch method.

7. The method of claim 6, wherein the sacrificial layer includes a material having an etch selectivity different from those of the protection layer, the capping layer, and the intercell insulating layer.

8. The method of claim 7, wherein the sacrificial layer includes silicon oxide,
wherein the silicon oxide is suitable for causing substantially no thermal attack to the variable resistor device during the removing of the sacrificial layer pattern, and
wherein the protection layer, the capping layer, and the intercell insulating layer respectively include silicon nitride.

9. The method of claim 3, further comprising:
after the removing of the sacrificial layer pattern, forming a spacer over the variable resistor device and in the hole which is generated by removing the sacrificial layer pattern in such a manner that the contact area between the upper electrode and the variable resistor device is smaller than the upper surface area of the variable resistor device.

10. The method of claim 9, wherein the forming of the spacer includes:
forming a spacer formation material in the hole which is generated by removing the sacrificial layer pattern; and
etching a portion of the spacer formation material and the protection layer pattern to expose a partial surface of the variable resistor device.

11. The method of claim 10, wherein the spacer has substantially the same etch selectivity as the protection layer pattern.

12. The method of claim 9, wherein the upper electrode is formed over the variable resistor device and over the spacer.

13. The method of claim 1, wherein the variable resistance layer is formed by deposition.

* * * * *